United States Patent
Gupta et al.

(10) Patent No.: US 11,825,593 B2
(45) Date of Patent: Nov. 21, 2023

(54) THROUGH BOARD VIA HEAT SINK

(71) Applicant: APTIV TECHNOLOGIES LIMITED, St. Michael (BB)

(72) Inventors: Navneet Gupta, Karnataka (IN); Kesav Kumar Sridharan, Bengaluru (IN); Scott Brandenburg, Kokomo, IN (US)

(73) Assignee: Aptiv Technologies Limited, St. Michael (BB)

( * ) Notice: Subject to any disclaimer, the term of this patent is extended or adjusted under 35 U.S.C. 154(b) by 51 days.

(21) Appl. No.: 17/701,767

(22) Filed: Mar. 23, 2022

(65) Prior Publication Data
US 2022/0418086 A1    Dec. 29, 2022

(30) Foreign Application Priority Data
Jun. 28, 2021   (IN) .............................. 202141028868

(51) Int. Cl.
| | |
|---|---|
| *H05K 1/02* | (2006.01) |
| *H05K 1/18* | (2006.01) |
| *H05K 1/11* | (2006.01) |
| *H05K 7/20* | (2006.01) |
| *H01L 23/498* | (2006.01) |

(52) U.S. Cl.
CPC ........... *H05K 1/0206* (2013.01); *H05K 1/113* (2013.01); *H05K 1/181* (2013.01); *H05K 7/20154* (2013.01); *H01L 23/49816* (2013.01); *H05K 2201/066* (2013.01); *H05K 2201/10378* (2013.01); *H05K 2201/10734* (2013.01)

(58) Field of Classification Search
CPC ............. H05K 1/0206; H05K 7/20154; H05K 2201/066; H05K 2201/10734
See application file for complete search history.

(56) References Cited

U.S. PATENT DOCUMENTS

| | | | | |
|---|---|---|---|---|
| 5,113,315 A | * | 5/1992 | Capp | .................... H05K 1/0206 361/708 |
| 5,710,459 A | * | 1/1998 | Teng | ...................... H01L 23/10 257/E23.105 |
| 5,721,454 A | * | 2/1998 | Palmer | ............. H01L 23/49827 257/E23.105 |

(Continued)

FOREIGN PATENT DOCUMENTS

EP        0871352 A1    10/1998

OTHER PUBLICATIONS

Extended European Search Report for Application No. EP 22 17 8219.6 dated Dec. 5, 2022.

*Primary Examiner* — Sherman Ng
(74) *Attorney, Agent, or Firm* — Harness, Dickey & Pierce, P.L.C.

(57) ABSTRACT

An illustrative example embodiment of an electronic device includes an integrated circuit component having a plurality of solder balls on one side. The substrate includes a first side adjacent the one side of the integrated circuit component. The substrate includes a plurality of openings. At least some of those openings are aligned with the solder balls. A cooling plate is situated toward a second side of the substrate. A thermally conductive material within the plurality of openings is thermally coupled with the cooling plate. At least some of the thermally conductive material is thermally coupled with the solder balls.

16 Claims, 4 Drawing Sheets

(56) References Cited

U.S. PATENT DOCUMENTS

| | | | | |
|---|---|---|---|---|
| 5,990,550 | A * | 11/1999 | Umezawa | H05K 1/0206 |
| | | | | 257/713 |
| 6,611,055 | B1 | 8/2003 | Hashemi | |
| 7,269,017 | B2 * | 9/2007 | Berlin | H05K 1/0206 |
| | | | | 257/713 |
| 7,646,093 | B2 * | 1/2010 | Braunisch | H05K 1/0204 |
| | | | | 438/117 |

\* cited by examiner

THROUGH BOARD VIA HEAT SINK

CROSS REFERENCE TO RELATED APPLICATION

This application claims priority to Indian Provisional Application No. 202141028868, filed on 28 Jun. 2021.

BACKGROUND

Contemporary passenger vehicles include a variety of electronic components. Advances in technology have made it possible to include a variety of sensing and control features. For example, many vehicles now include a camera and RADAR or LIDAR detectors. Such devices often include a ball grid array (BGA) integrated circuit.

One challenge associated with such electronic components on a vehicle is providing adequate cooling for the device. The camera lens or the cover over the sensor presents one of the limitations on cooling the BGA. The lens or cover not only retains heat but also blocks any cooling from the forward-facing side of the device. The opposite side is supported on a printed circuit board, which interferes with cooling the BGA from that side.

SUMMARY

An illustrative example embodiment of an electronic device includes an integrated circuit component having a plurality of solder balls on one side. The substrate includes a first side adjacent the one side of the integrated circuit component. The substrate includes a plurality of openings. At least some of those openings are aligned with the solder balls. A cooling plate is situated toward a second side of the substrate. A thermally conductive material within the plurality of openings is thermally coupled with the cooling plate. At least some of the thermally conductive material is thermally coupled with the solder balls.

In an example embodiment having at least one feature of the electronic device of the previous paragraph, the plurality of openings comprise vias through the substrate and the vias are lined with a conductive material that surrounds the thermally conductive material.

In an example embodiment having at least one feature of the electronic device of either of the previous paragraphs, the cooling plate comprises the thermally conductive material and the thermally conductive material within the plurality of openings forms extensions from the cooling plate.

In an example embodiment having at least one feature of the electronic device of any of the previous paragraphs, the thermally conductive material within the plurality of openings is configured as a plurality of fins.

In an example embodiment having at least one feature of the electronic device of any of the previous paragraphs, the thermally conductive material within the plurality of openings is configured as a plurality of posts.

An example embodiment having at least one feature of the electronic device of any of the previous paragraphs includes a thermal interface material between the cooling plate and the second side of the substrate.

An example embodiment having at least one feature of the electronic device of any of the previous paragraphs includes a plurality of fins thermally coupled to the cooling plate, the plurality of fins being on a side of the cooling plate that is opposite the second side of the substrate.

An example embodiment having at least one feature of the electronic device of any of the previous paragraphs includes a second cooling plate thermally coupled to the plurality of fins wherein the plurality of fins are situated between the cooling plate and the second cooling plate.

An example embodiment having at least one feature of the electronic device of any of the previous paragraphs includes a fan associated with the second cooling plate, the fan being configured to cause airflow across the plurality of fins.

In an example embodiment having at least one feature of the electronic device of any of the previous paragraphs, the thermally conductive material comprises a metal including at least one of copper, aluminum or bronze.

An illustrative example embodiment of a method of cooling an electronic device including an integrated circuit component having a plurality of solder balls on one side and a substrate having a first side adjacent the one side of the integrated circuit component includes situating a cooling plate toward a second side of the substrate. A thermally conductive material is situated within a plurality of openings in the substrate such that the thermally conductive material is coupled with the cooling plate and at least some of the thermally conductive material is thermally coupled with the solder balls. Heat is dissipated from the integrated circuit component by conducting the heat along the thermally conductive material whereby the heat can be radiated from the cooling plate.

In an example embodiment having at least one feature of the method of the previous paragraph, the plurality of openings comprise vias through the substrate and the vias are lined with a conductive material that surrounds the thermally conductive material.

In an example embodiment having at least one feature of the method of any of the previous paragraphs, the cooling plate comprises the thermally conductive material, the thermally conductive material within the plurality of openings forms extensions from the cooling plate, and situating the thermally conductive material comprises inserting the extensions into the openings in the substrate.

In an example embodiment having at least one feature of the method of any of the previous paragraphs, the thermally conductive material within the plurality of openings is configured as a plurality of fins and situating the thermally conductive material comprises inserting the fins into the openings in the substrate.

In an example embodiment having at least one feature of the method of any of the previous paragraphs, the thermally conductive material within the plurality of openings is configured as a plurality of posts and situating the thermally conductive material comprises inserting the posts into the openings in the substrate.

An example embodiment having at least one feature of the method of any of the previous paragraphs includes placing a thermal interface material between the cooling plate and the second side of the substrate.

An example embodiment having at least one feature of the method of any of the previous paragraphs includes thermally coupling a plurality of fins to the cooling plate on a side of the cooling plate that is opposite the second side of the substrate.

An example embodiment having at least one feature of the method of any of the previous paragraphs includes thermally coupling a second cooling plate to the plurality of fins, wherein the plurality of fins are situated between the cooling plate and the second cooling plate.

An example embodiment having at least one feature of the method of any of the previous paragraphs includes using a fan associated with the second cooling plate to cause airflow across the plurality of fins.

In an example embodiment having at least one feature of the method of any of the previous paragraphs, the thermally conductive material comprises a metal including at least one of copper, aluminum or bronze.

The various features and advantages of at least one disclosed example embodiment will become apparent to those skilled in the art from the following detailed description. The drawings that accompany the detailed description can be briefly described as follows.

DETAILED DESCRIPTION

Disclosed example embodiments provide temperature control for electronic devices, such as cameras or detectors that may be associated with a vehicle. The electronic devices include an integrated circuit component supported on one side of a substrate and a cooling plate situated on an opposite side of the substrate. A thermally conductive material is situated in openings in the substrate to conduct heat from the integrated circuit component to the cooling plate. Disclosed example embodiments provide effective temperature control using a through-board heat sink to provide cooling for an electronic device that cannot effectively be cooled from the side of the substrate on which the integrated circuit component is supported.

Figure 1:
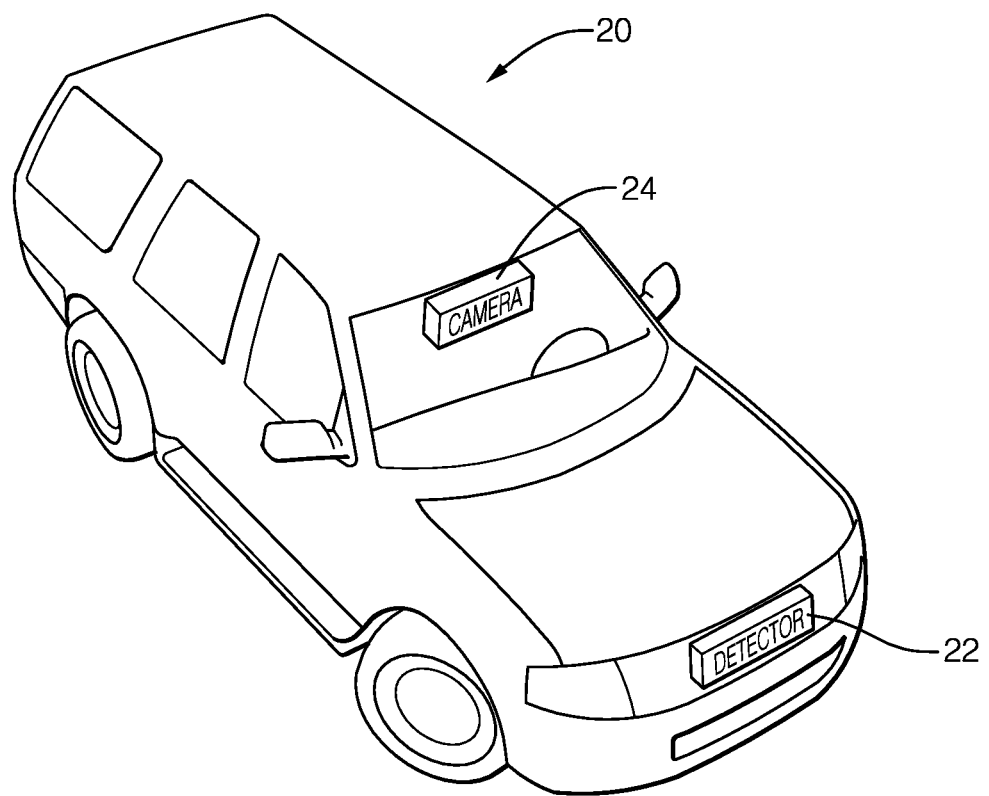
FIG. 1 diagrammatically illustrates selected portions of a vehicle including a plurality of detecting devices.

FIG. 1 schematically illustrates an example vehicle 20 that includes a plurality of electronic devices. For discussion purposes, a detector 22, such as a RADAR or LIDAR detector, and a camera 24 are example electronic devices on the vehicle 20. Each of the detector 22 and the camera 24 includes an integrated circuit component that requires some temperature control or cooling to ensure desired operation of the device over time.

Figure 2:
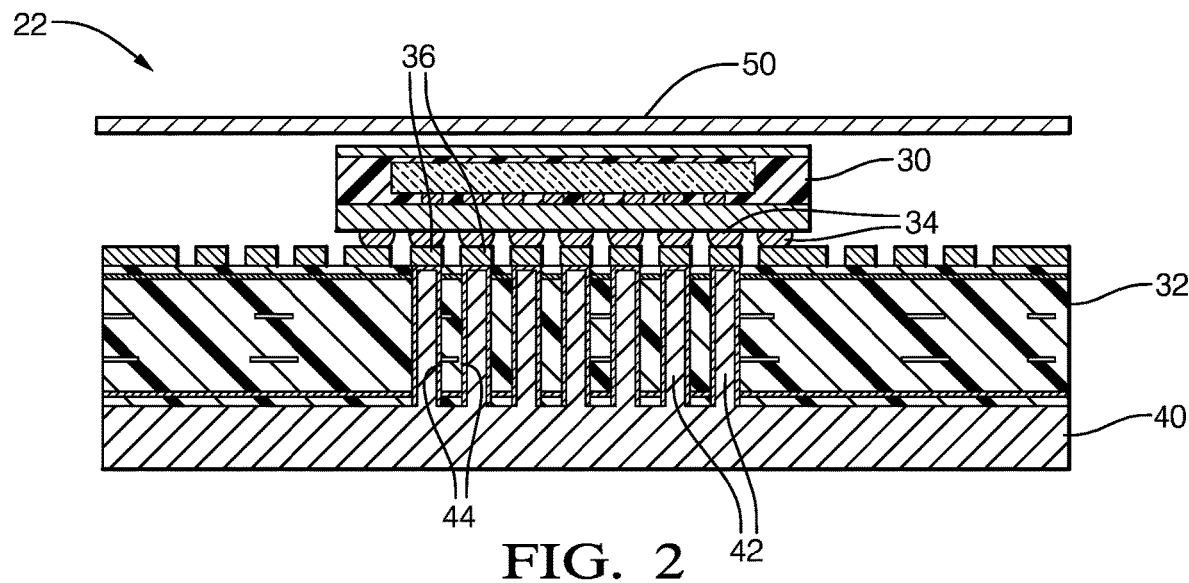
FIG. 2 is a cross-sectional schematic illustration of an electronic device including a heat sink configuration designed according to an example embodiment.

FIG. 2 is a cross-sectional illustration schematically illustrating at least portions of the detector 22. An integrated circuit component 30 is supported on a substrate 32. The integrated circuit component 30 includes a ball grid array (BGA) of solder balls 34 on one side of the integrated circuit component 30. At least some of the solder balls 34 are secured to solder pads 36 on a first side of the substrate 32. The substrate 32 includes a dielectric material and a metallic layer on the first side like many known printed circuit boards.

A cooling plate 40 is situated toward a second side of the substrate 32. A thermally conductive material 42 is situated within a plurality of openings 44 in the substrate 32. At least some of the thermally conductive material 42 is thermally coupled with the solder balls 34. The thermally conductive material 42 is thermally coupled with the cooling plate 40.

The thermally conductive material 42 in some example embodiments comprises metal. For example, the thermally conductive material comprises at least one of copper, aluminum, or bronze. The material of the cooling plate 40 may be the same as the thermally conductive material 42. In some example embodiments, the cooling plate 40 comprises a different material than the thermally conductive material 42.

Figure 3:
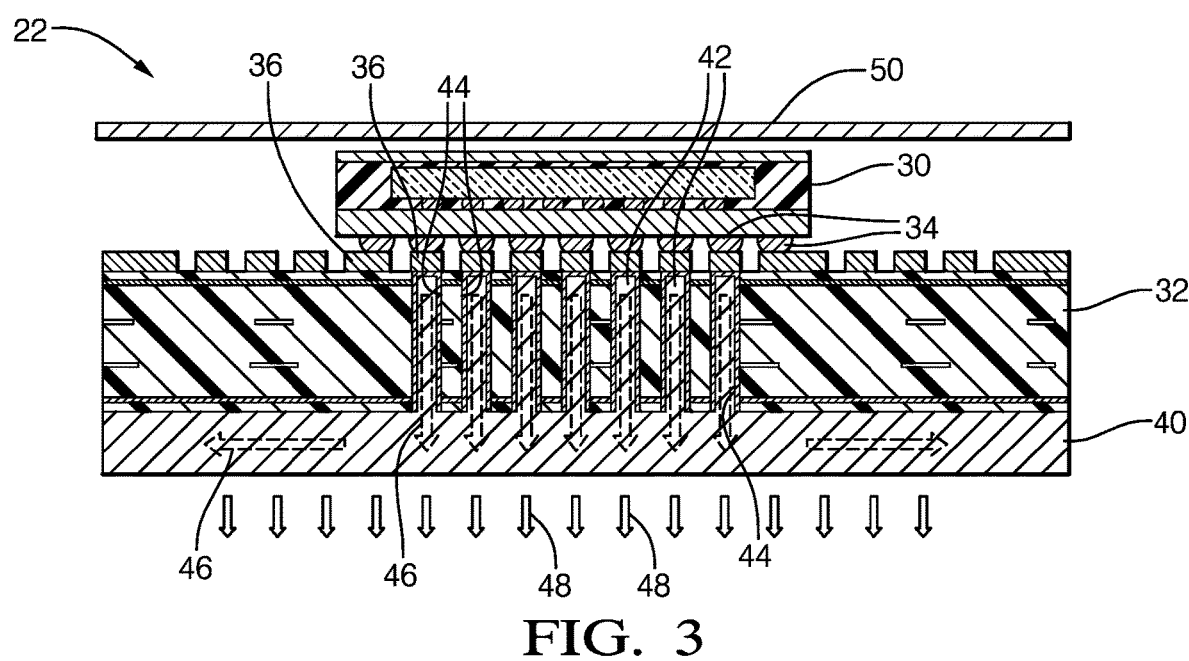
FIG. 3 schematically illustrates heat dissipation provided by the embodiment shown in FIG. 2.

The thermally conductive material 42 and the cooling plate 40 are effective for dissipating heat away from the integrated circuit component 30 by conducting heat as schematically shown by the broken line arrows 46 in FIG. 3. The cooling plate 40 radiates heat away from the integrated circuit component 30 and the substrate 32 as schematically represented by the arrows 48.

The cooling plate 40 and thermally conductive material 42 within the openings 44 provides cooling on an opposite side of the substrate 32 from the integrated circuit component 30. In FIGS. 2 and 3, the integrated circuit component 30 is part of the detector 22, which includes a cover or radome 50 on the side of the integrated circuit component 30 that is used for detecting purposes. By situating the cooling plate 40 and the thermally conductive material 42 as shown, the temperature of the integrated circuit component 30 can be managed in an efficient and effective manner.

The detector 22 is shown in FIGS. 2 and 3 for discussion purposes. The camera 24 would be similarly provided with a heat sink assembly including a cooling plate 40 and thermally conductive material 42. The camera 24 would not include a radome 50 but does include a lens and otherwise is not able to be cooled from the side of the integrated circuit component 30 that faces in the direction of the camera's field of view.

Figure 4:
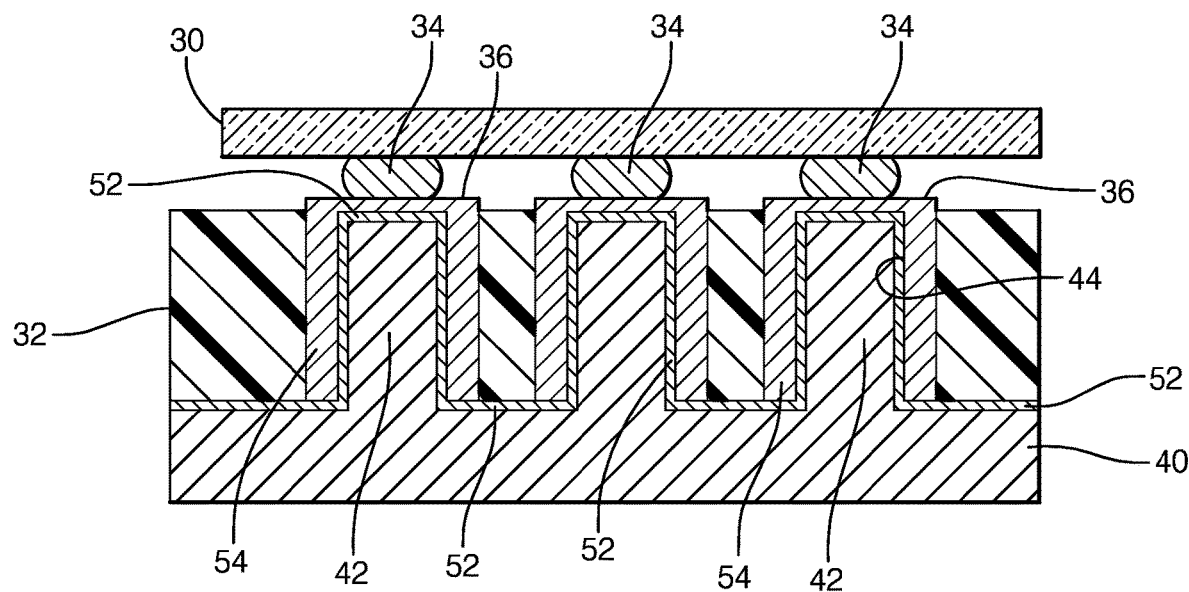
FIG. 4 is a cross-sectional illustration schematically illustrating selected features of an embodiment consistent with that shown in FIG. 2.

FIG. 4 is schematically illustrates an example arrangement in which the openings 44 in the substrate 32 are vias. The thermally conductive material 42 is formed as fins or posts that are received within the vias or openings 44. In the example of FIG. 4, a thermal interface material 52, such as a paste, provides consistent contact and thermal conduction between the thermally conductive material 42 and metallic liners 54 within the openings 44. In the example of FIG. 4, the solder pads 36 effectively close off one side of the openings 44 such that the openings 44 can be considered blind holes in the substrate 32.

Figure 5:
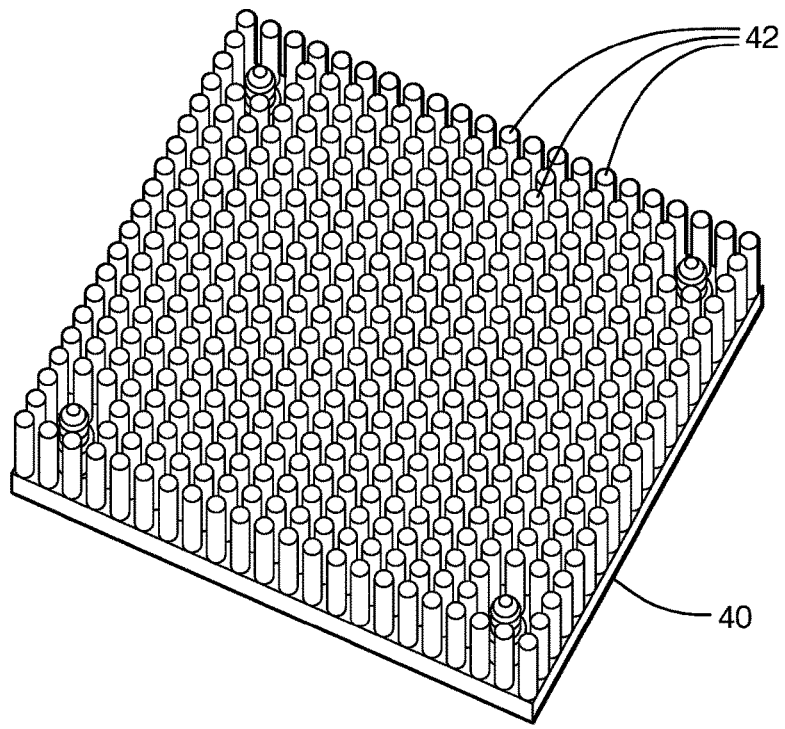
FIG. 5 diagrammatically illustrates, in perspective view, an example cooling plate and cooling fins.

FIG. 5 shows an example configuration of a cooling plate 40 having a plurality of fins or posts 42 of the thermally conductive material secured to the cooling plate 40. In some example embodiments, the cooling plate 40 and the fins of thermally conductive material 42 are formed as a single-piece structure. In other embodiments, the fins or posts of thermally conductive material 42 are secured to a cooling plate 40 by brazing, for example. With an arrangement like that shown in FIG. 5, the fins or posts of thermally conductive material 42 may be inserted into the openings 44 of the substrate 32 to establish the thermally conductive connection between the solder balls 34 and the cooling plate 40. The fins or posts of thermally conductive material 42 may be coated with a thermal interface material 52 prior to insertion in the openings 44. Alternatively, a thermal interface material 52 may be placed within the openings 44 prior to the fins or posts being inserted.

Figure 6:
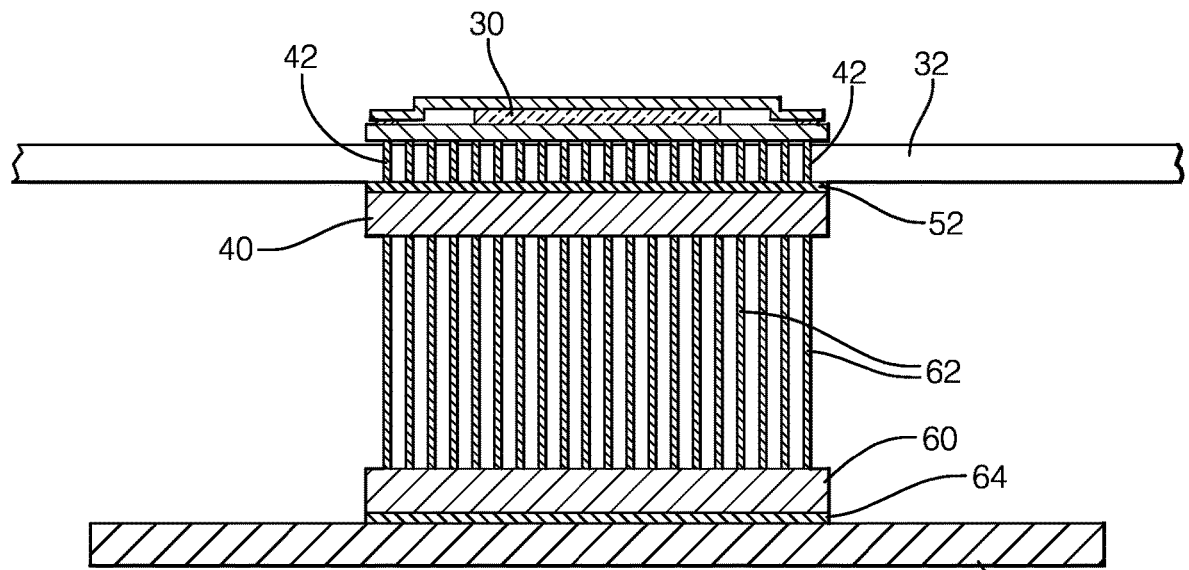
FIG. 6 schematically illustrates another example configuration of a heat sink.

FIG. 6 illustrates an example arrangement in which the integrated circuit component 30 is supported on the substrate 32 with a thermal interface material 52 received between the cooling plate 40 and the substrate 32. A second cooling plate 60 and a second set of fins 62 are thermally coupled with the cooling plate 40. The fins 62 operate like a heat exchanger when air or another fluid passes through the space occupied by the fins 62. In this example, an adhesive 64, which may be thermally conductive, secures the second cooling plate 60 to a housing 66 of the detector 22 (or camera 24). The second set of cooling fins 62 and the second cooling plate 60 provide additional temperature control to further cool the integrated circuit component 30. The second cooling plate 60 may provide additional heat absorption and dissipation as heat from the cooling plate 40 is conducted along the fins 62 to the second cooling plate 60.

Figure 7:
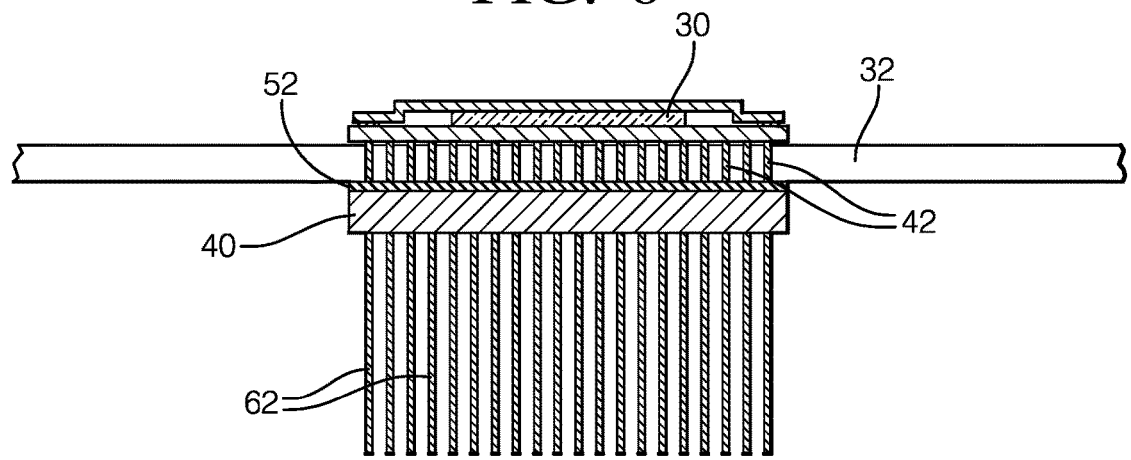
FIG. 7 schematically illustrates another configuration of a heat sink.

FIG. 7 illustrates another example configuration in which a second set of fins 62 are provided on the cooling plate 40. In this example arrangement, a second cooling plate is not provided.

Figure 8:
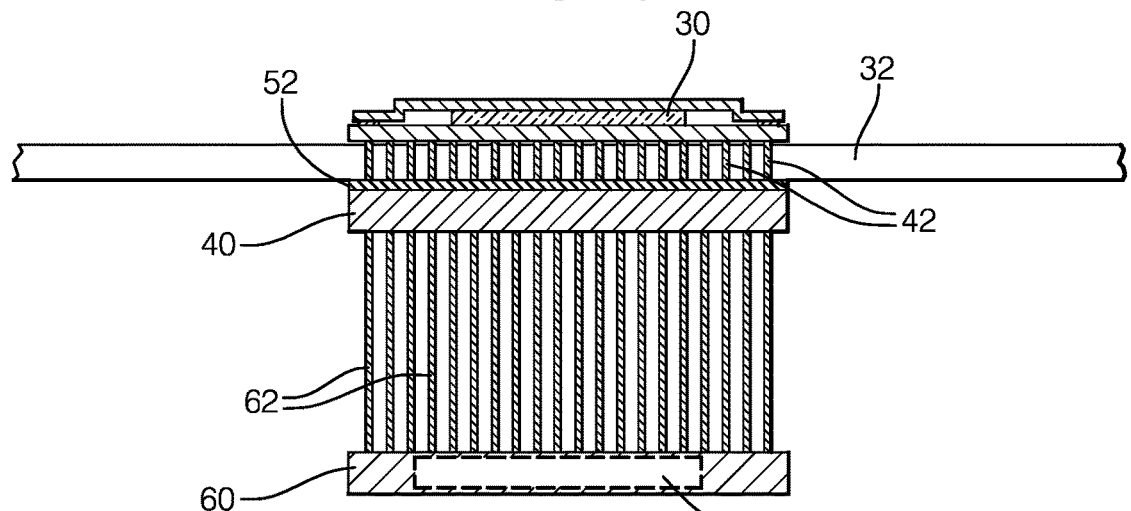
FIG. 8 schematically illustrates another heat sink configuration.

FIG. 8 illustrates another example arrangement in which a second cooling plate 60 includes a fan 70 situated on or within the second cooling plate 60. The fan 70 operates to draw air across the second set of fins 62 to provide additional cooling compared to the arrangement shown in FIG. 6, for example.

Having a cooling plate 40 situated on an opposite side of the substrate 32 from the integrated circuit component 30 provides effective temperature control using a through-board heat sink to provide cooling for an electronic device that cannot effectively be cooled from the side of the substrate 32 on which the integrated circuit component 30 is supported.

The illustrated example embodiments are not necessarily limited to the features shown in the different figures. Various combinations of the disclosed features are possible to realize other embodiments.

The preceding description is exemplary rather than limiting in nature. Variations and modifications to the disclosed examples may become apparent to those skilled in the art that do not necessarily depart from the essence of this invention. The scope of legal protection given to this invention can only be determined by studying the following claims.

We claim:

1. An electronic device, comprising: an integrated circuit component including a plurality of solder balls on one side; a substrate including a first side adjacent the one side of the integrated circuit component, the substrate including a plurality of openings in the substrate, at least some of the plurality of openings being aligned with the solder balls; a cooling plate situated toward a second side of the substrate; a thermally conductive material within the plurality of openings and thermally coupled with the cooling plate, at least some of the thermally conductive material being thermally coupled with the solder balls; a plurality of fins thermally coupled to the cooling plate, the plurality of fins being on a side of the cooling plate that is opposite the second side of the substrate; and a second cooling plate thermally coupled to the plurality of fins wherein the plurality of fins are situated between the cooling plate and the second cooling plate.

2. The electronic device of claim 1, wherein the plurality of openings comprise vias through the substrate, and the vias are lined with a conductive material that surrounds the thermally conductive material.

3. The electronic device of claim 1, wherein the cooling plate comprises the thermally conductive material and the thermally conductive material within the plurality of openings forms extensions from the cooling plate.

4. The electronic device of claim 1, wherein the thermally conductive material within the plurality of openings is configured as a plurality of fins.

5. The electronic device of claim 1, wherein the thermally conductive material within the plurality of openings is configured as a plurality of posts.

6. The electronic device of claim 1, comprising a thermal interface material between the cooling plate and the second side of the substrate.

7. The electronic device of claim 1, comprising a fan associated with the second cooling plate, the fan being configured to cause airflow across the plurality of fins.

8. The electronic device of claim 1, wherein the thermally conductive material comprises a metal including at least one of copper, aluminum or bronze.

9. A method of cooling an electronic device including an integrated circuit component having a plurality of solder balls on one side and a substrate having a first side adjacent the one side of the integrated circuit component, the method comprising: situating a cooling plate toward a second side of the substrate; situating a thermally conductive material within a plurality of openings in the substrate such that the thermally conductive material is coupled with the cooling plate and at least some of the thermally conductive material is thermally coupled with the solder balls; dissipating heat from the integrated circuit component by conducting the heat along the thermally conductive material whereby the heat can be radiated from the cooling plate; thermally coupling a plurality of fins to the cooling plate on a side of the cooling plate that is opposite the second side of the substrate; and thermally coupling a second cooling plate to the plurality of fins, wherein the plurality of fins are situated between the cooling plate and the second cooling plate.

10. The method of claim 9, wherein the plurality of openings comprise vias through the substrate, and the vias are lined with a conductive material that surrounds the thermally conductive material.

11. The method of claim 9, wherein the cooling plate comprises the thermally conductive material, the thermally conductive material within the plurality of openings forms extensions from the cooling plate, and situating the thermally conductive material comprises inserting the extensions into the openings in the substrate.

12. The method of claim 9, wherein the thermally conductive material within the plurality of openings is configured as a plurality of fins, and situating the thermally conductive material comprises inserting the fins into the openings in the substrate.

13. The method of claim 9, wherein the thermally conductive material within the plurality of openings is configured as a plurality of posts, and situating the thermally conductive material comprises inserting the posts into the openings in the substrate.

14. The method of claim 9, comprising placing a thermal interface material between the cooling plate and the second side of the substrate.

15. The method of claim 9, comprising using a fan associated with the second cooling plate to cause airflow across the plurality of fins.

16. The method of claim 9, wherein the thermally conductive material comprises a metal including at least one of copper, aluminum or bronze.

* * * * *